United States Patent
Zaytsev et al.

(10) Patent No.: US 8,977,925 B2
(45) Date of Patent: Mar. 10, 2015

(54) EFFICIENT WAY TO CONSTRUCT LDPC CODE BY COMPARING ERROR EVENTS USING A VOTING BASED METHOD

(71) Applicant: LSI Corporation, San Jose, CA (US)

(72) Inventors: Denis Vladimirovich Zaytsev, Dzerzhinsky (RU); Denis Vasilievich Parfenov, Moscow (RU); Yang Han, Sunnyvale, CA (US); Ivan Leonidovich Mazurenko, Khimki (RU); Dmitry Nicolaevich Babin, Moscow (RU)

(73) Assignee: LSI Corporation, San Jose, CA (US)

( * ) Notice: Subject to any disclaimer, the term of this patent is extended or adjusted under 35 U.S.C. 154(b) by 80 days.

(21) Appl. No.: 13/743,381

(22) Filed: Jan. 17, 2013

(65) Prior Publication Data

US 2014/0095955 A1   Apr. 3, 2014

(51) Int. Cl.
*H03M 13/00* (2006.01)
*H03M 13/37* (2006.01)
*H03M 13/11* (2006.01)

(52) U.S. Cl.
CPC ...... *H03M 13/3738* (2013.01); *H03M 13/1142* (2013.01)
USPC ........................... 714/752; 714/758; 714/805

(58) Field of Classification Search
CPC .................................................. H03M 13/1142
USPC ........................................ 714/752, 758, 805
See application file for complete search history.

(56) References Cited

U.S. PATENT DOCUMENTS

| | | | |
|---|---|---|---|
| 7,743,315 B2 | 6/2010 | Li et al. | |
| 8,196,016 B1 * | 6/2012 | Langner et al. | 714/758 |
| 8,301,984 B1 * | 10/2012 | Zhang et al. | 714/780 |
| 8,499,218 B2 * | 7/2013 | Yedidia et al. | 714/758 |
| 8,640,002 B1 * | 1/2014 | Varanasi | 714/758 |
| 8,649,469 B2 * | 2/2014 | Yu et al. | 375/343 |
| 8,656,245 B2 * | 2/2014 | Hamkins | 714/752 |
| 8,689,074 B1 * | 4/2014 | Tai | 714/752 |

* cited by examiner

*Primary Examiner* — Esaw Abraham
(74) *Attorney, Agent, or Firm* — Suiter Swantz pc llo

(57) ABSTRACT

A method for ordering trapping sets to find one or more dominant trapping sets includes analyzing a trapping set and a random set of codewords to generate a distance value for each trapping set, and ordering the trapping sets by the distance value. Distance values may be determined for each trapping set by tracking a vote count wherein a correct decode at a certain noise level produces a "right" vote and an incorrect decode at a certain noise level produces a "left" vote. A certain threshold number of "left" votes terminates processing at that noise level.

20 Claims, 5 Drawing Sheets

EFFICIENT WAY TO CONSTRUCT LDPC CODE BY COMPARING ERROR EVENTS USING A VOTING BASED METHOD

PRIORITY

The present application claims the benefit under 35 U.S.C. §119(a) of Russian Patent Application Number 2012141880, filed Oct. 1, 2012, which is incorporated herein by reference.

FIELD OF THE INVENTION

The present invention is directed generally toward low-density parity check (LDPC) codes, and more particularly toward methods for estimating error characteristics for LDPC codes.

BACKGROUND OF THE INVENTION

In most real signal transmission applications there can be several sources of noise and distortions between the source of the signal and its receiver. As a result, there is a strong need to correct mistakes in the received signal. As a solution for this task one should use some coding technique with adding some additional information (i.e., additional bits to the source signal) to ensure correcting errors in the output distorted signal and decoding it. One type of coding technique utilizes low-density parity-check (LDPC) codes. LDPC codes are used because of their fast decoding (linearly depending on codeword length) property.

For large block sizes, LDPC codes are commonly constructed by first studying the behavior of decoders. LDPC codes are capacity-approaching codes, i.e. these codes can approach channel capacity for standard additive white Gaussian noise (AWGN) channels.

The construction of a specific LDPC code utilizes two main techniques; pseudo-random approaches and combinatorial approaches. Construction by a pseudo-random approach builds on theoretical results that, for large block sizes, give good decoding performance. In general, pseudo-random codes have complex encoders; however pseudo-random codes with the best decoders can have simple encoders. Various constraints are often applied to help ensure that the desired properties expected at the theoretical limit of infinite block size occur at a finite block size. Combinatorial approaches can be used to optimize properties of small block-size LDPC codes or to create codes with simple encoders.

LDPC codes are linear codes with a sparse parity-check matrix. Sparse here means that the number of non-zero elements is a linear function of the size of the codewords.

It is known that decoding a LDPC code on the binary symmetric channel is an NP-complete problem. So in order to ensure fast (linear) decoding, different techniques based on iterative belief propagation are used and give good approximations. But on the output of such iterative methods we can have words that are not codeword (because of the nature of belief propagation, the level of noise and so on), but some other word.

An output of such iterative methods which doesn't coincide with the original codeword may still be a valid codeword. This is a very bad situation for the decoder because the decoder does not have the ability to identify the valid but erroneous word. Hereafter such a situation will be called a miscorrection.

There exists a well-known technique called Importance Sampling, which is the modification of a Monte-Carlo method for the region which has the biggest error probability. One of the applications of the Importance Sampling method for finding low error rates (having the small level of noise) is the Cole method presented in a paper by Cole et al (A General Method for Finding Low Error Rates of LDPC Codes) hereby incorporated by reference. The Cole method deals with so-called trapping sets or near codewords, i.e. some words, which are not codewords but can be converted to codewords with small effort, and leading to errors in case of small levels of noise. A trapping set is a set of variable nodes that is not well connected to the rest of the tanner graph, forming relatively isolated subgraphs, in a way that causes error conditions in the decoder. Trapping sets depend on the decoder's parity check matrix, and on the decoding algorithm.

The second step of the Cole method is used to select dominant (i.e. having more impact on probability of error) codewords and trapping sets from a list of codewords. Considering a segment in a graph with the codeword on the left terminus and a given trapping set on the right terminus; movement along the segment is controlled by varying the amplitude of specially injected noise. The second step of the Cole method finds a critical noise level (resulted in squared error boundary distance) using a binary search along the segment. At a particular noise level, the critical noise level is moved to the right if the codeword is correctly decoded and to the left if the codeword is decoded as the trapping set. So, if the amplitude of the noise is greater than the critical level then the decoder gets the trapping set with a fairly high probability. The importance of the given trapping set for an original codeword corresponds to the distance from the original code word to a critical point on the segment.

The Cole method is formulated for use in additive white Gaussian noise (AWGN) channels. In AWGN channels the resulting error boundary distance does not depend on the original codeword located at the left point of the corresponding segment: instead, we can consider any valid codeword that satisfies the linearity requirement on the left and the product of an exclusive disjunction operation of the codeword and trapping set on the right. This can be explained by variable independence in Gaussian noise channel and linear properties of LDPC code.

Unlike AWGN channel there exist a variety of other channel types with ISI (inter symbol interference) like PR (partial response) or Jitter channels. For these channels the second step of the Cole method will give significantly different estimations of error boundary distance for different random codewords. These non-stationary features of such channels require considering a set of randomly chosen original codewords. The straightforward approach is to calculate an arithmetic average error boundary distances along a big number of random codewords. Due to the distribution of error boundary distance along all random codewords, this averaging in most cases does not give a good estimation of trapping set impact on overall error probability. Therefore, this method cannot be used to sort trapping sets. Moreover, estimating the average distance has a tendency to diverge as a number of random codewords increase.

The error floor phenomenon is related to all iterative decoding of LDPC codes. It was discovered that the error floors under message-passing iterative decoding are usually due to low-weight trapping sets rather than low-weight codewords. Another (more rare) type of errors is related to miscorrection events mentioned above.

Estimating probability of error could be made by running a direct simulation. But considering the real levels of error for high signal-to-noise ratios in modern hard disk drives, there is no possibility to get a real error probability estimation in a reasonable time.

Consequently, it would be advantageous if an apparatus existed that is suitable for measuring error injection level to provide a fast, reliable method for ordering trapping sets.

SUMMARY OF THE INVENTION

Accordingly, the present invention is directed to a novel method and apparatus for measuring error injection level to provide a fast, reliable method for ordering trapping sets.

One embodiment of the present invention is a method for measuring error injection level and ordering trapping sets comprising selecting a set of codewords and processing each word at a given noise level. If all codewords decode correctly, move an error boundary to the right; if more than some threshold number of codewords are decoded as the expected trapping set, move the error boundary to the left.

Another embodiment of the present invention is a processor for calculating an error injection level and ordering trapping sets. The processor selects a set of codewords and processes each word at a given noise level. If all codewords decode correctly, the processor moves an error boundary to the right; if more than some threshold number of codewords are decoded as the expected trapping set, the processor moves the error boundary to the left.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous objects and advantages of the present invention may be better understood by those skilled in the art by reference to the accompanying figures in which.

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

Figure 1:
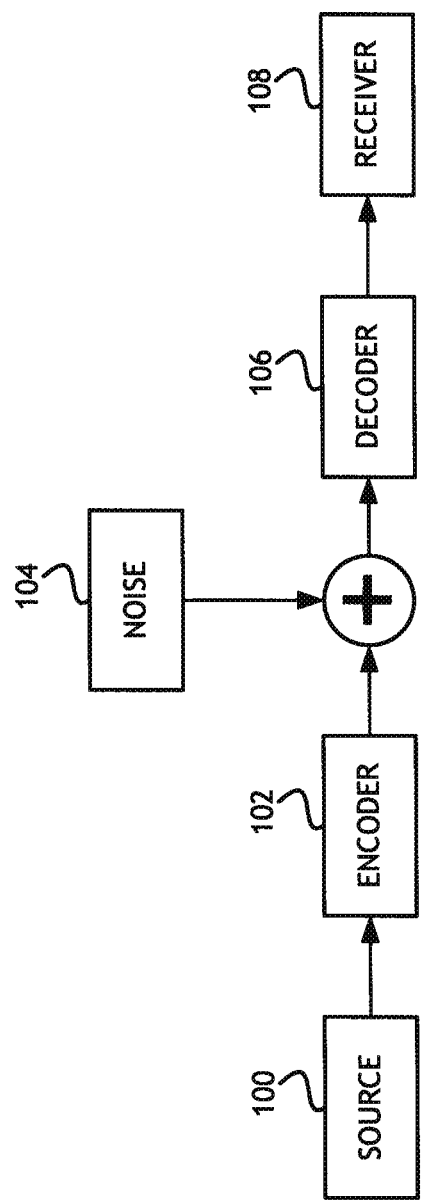
FIG. 1 shows a block diagram of a data transmission path for a LDPC code.

Referring to FIG. 1, a block diagram of a data transmission path for a LDPC code is shown. The standard data transmission path may include a signal source 100 that generates a signal for transmission. The present invention may relate to digital signals. The signal produced by the source 100 may be encoded by an encoder 102. The encoder 102 may be a processor configured to add features to the signal that enhance data integrity. For example, the encoder 102 may add data bits to the signal according to some predetermined algorithm so that the signal may be recovered in the event of distortion. An example of a predetermined algorithm may include an LDPC code configured to add one or more parity bits to the each codeword in the signal.

The encoded signal may then be transmitted. During transmission, signals may be subjected to noise 104. Noise 104 may distort one or more bits of the signal such that the signal is no longer an accurate representation of the signal produced by the source 100. The noise distorted signal may then be received by a decoder 106. The decoder 106 may analyze the noise distorted signal according to an algorithm complimentary to the algorithm used by the encoder 104. Where the algorithm includes a LDPC code, the decoder 106 may utilize one or more parity bits generated by the LDPC code to recover noise distorted bits in the noise distorted signal. The recovered signal may then be sent to a receiver 108.

Figure 2:
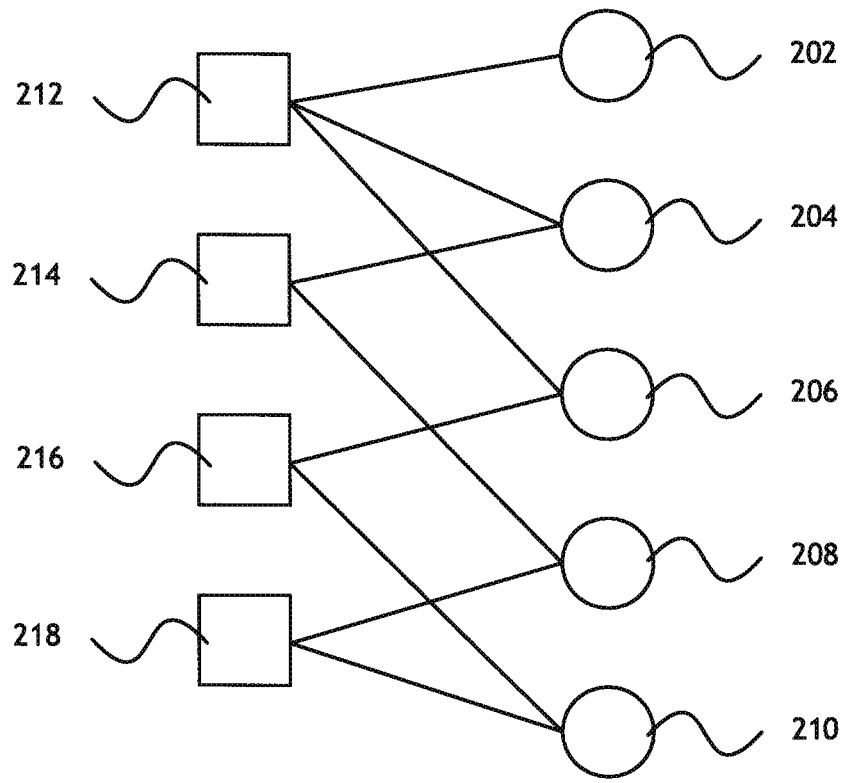
FIG. 2 shows a tanner graph of a LDPC code.

Referring to FIG. 2, a tanner graph of a LDPC code is shown. A tanner graph related to a LDPC code is a graphic representation of the corresponding parity-check matrix. The columns of that matrix may be represented by variable nodes 202, 204, 206, 208, 210 and the rows (check equations) may be represented by check nodes 212, 214, 216, 218. The tanner graph if FIG. 2 shows a LDPC code wherein a first check node 212 represents an equation corresponding to the parity-check matrix having the following non-zero variables: a first variable node 202, a second variable node 204 and a third variable node 206; a second check node 214 represents an equation having the following non-zero variables: the second variable node 204 and a fourth variable node 208; a third check node 216 represents an equation having the following non-zero variables: the third variable node 206 and a fifth variable node 210; and a fourth check node 218 represents an equation having the following non-zero variables: the fourth variable node 208 and the fifth variable node 210. One skilled in the art may appreciate that a tanner graph may be a representation of a LDPC code parity-check matrix, where check nodes correspond to rows, variable nodes correspond to columns, and check node and variable node are connected if a nonzero value stays in the intersection of the corresponding row and column.

There are two potential error conditions based on signal noise in LDPC decoding. In the first error condition, the signal received by the decoder does not correspond to a valid codeword; in that case the decoder may be able to recover the signal based on an algorithm using parity information contained in the signal, or the signal may be unrecoverable if the distortion is severe enough. The second error condition, herein called miscorrection, involves a distorted signal that is decoded to a valid but incorrect codeword, in which case the decoder may falsely believe that the signal has been properly decoded. Miscorrection may result when a valid codeword is distorted by noise in a particular way such that the distorted signal becomes closer to another (incorrect) valid code word, different from the correct one. The conditions that may produce miscorrection are specific to the particular LDPC code; furthermore, the probability of miscorrection may be associated with the nature and extent of signal noise, and the statistical distribution of various codewords.

Signal noise may include AWGN, partial response (PR), jitter, or other effects due to noisy transmission channels.

Selecting a LDPC code for a particular application involves analyzing the properties of various LDPC codes to select one with desirable error probabilities for the application. However, ordering a set of candidate LDPC codes according trapping set sand error probability may be a laborious and time consuming task. A method for selecting dominant trapping sets in a LDPC code and ordering such trapping sets would be advantageous.

Figure 3:
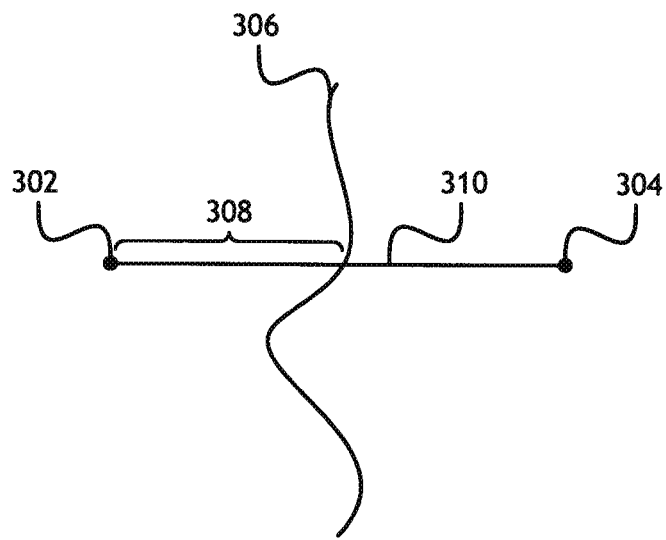
FIG. 3 shows a graph representation of an error boundary.

Referring to FIG. 3, a graph representation of an error boundary is shown. When analyzing a LDPC code, an error boundary 306 may be identified by finding a critical noise level for various segments 310 defined by a codeword 302 and a trapping set 304. Noise may be injected into a codeword 302 at various levels and then decoded. A critical noise level is the noise level wherein noise injected into a codeword for a particular LDPC code causes the codeword to be erroneously decoded into the trapping set 304 instead of the codeword 302. The critical noise level for a particular codeword may define a distance 308. A collection of distances 308 may define an error boundary 306. Establishing an error boundary 306 may require numerous iterations involving numerous segments 310 and numerous noise level iterations for each segment 310. Processing iterations to define an error boundary 306 may require substantial time and resources, and may produce erroneous results.

Figure 4:
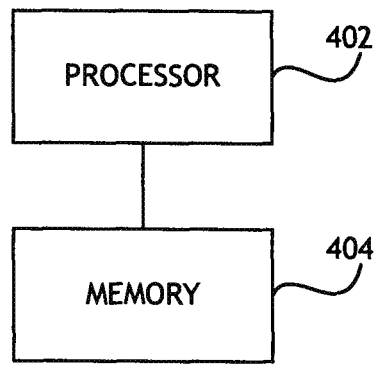
FIG. 4 shows a block diagram of a computing device useful for implementing embodiments of the present invention.

Referring to FIG. 4, a block diagram of a computing device useful for implementing embodiments of the present invention is shown. The computing device may include a processor 402 connected to a memory 404. The processor 302 may be configured to execute computer executable program code to implement methods according to embodiments of the present invention. The memory 304 may be configured to store computer executable program code to implement methods according to embodiments of the present invention and to store output of embodiments of the present invention in appropriate data structures.

Figure 5:
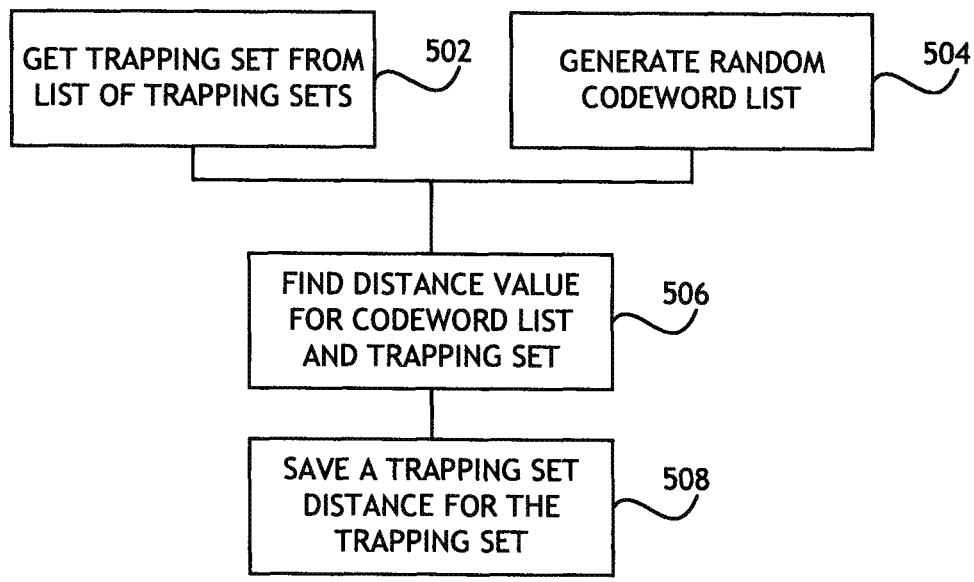
FIG. 5 shows a flowchart of a method for determining dominant trapping sets in a list of trapping sets.

Referring to FIG. 5, a flowchart of a method for determining dominant trapping sets in a list of trapping sets is shown. A processor may generate 504 a list of random, valid codewords and get 502 a trapping set from a list of trapping sets. Alternatively, the list of codewords may comprise a set of "important" codewords, such as codewords that statistically appear most often. The processor may then find 506 a distance value for the codeword list and the trapping set. The distance may be a function of one or more codewords in the codeword list, trapping set and noise level. Conversely, one skilled in the art may appreciate a critical noise level may be determined as a function of one or more codewords in a list of codewords, a trapping set and a distance value. The processor may then save the trapping set distance for the trapping set. When a processor has found distance values for every trapping set in the list of trapping sets, the processor may order the trapping sets based on the saved distance value to determine the dominant trapping sets. In depth analysis may then be performed on respective LDPC codes based on their dominant tapping sets.

Figure 6:
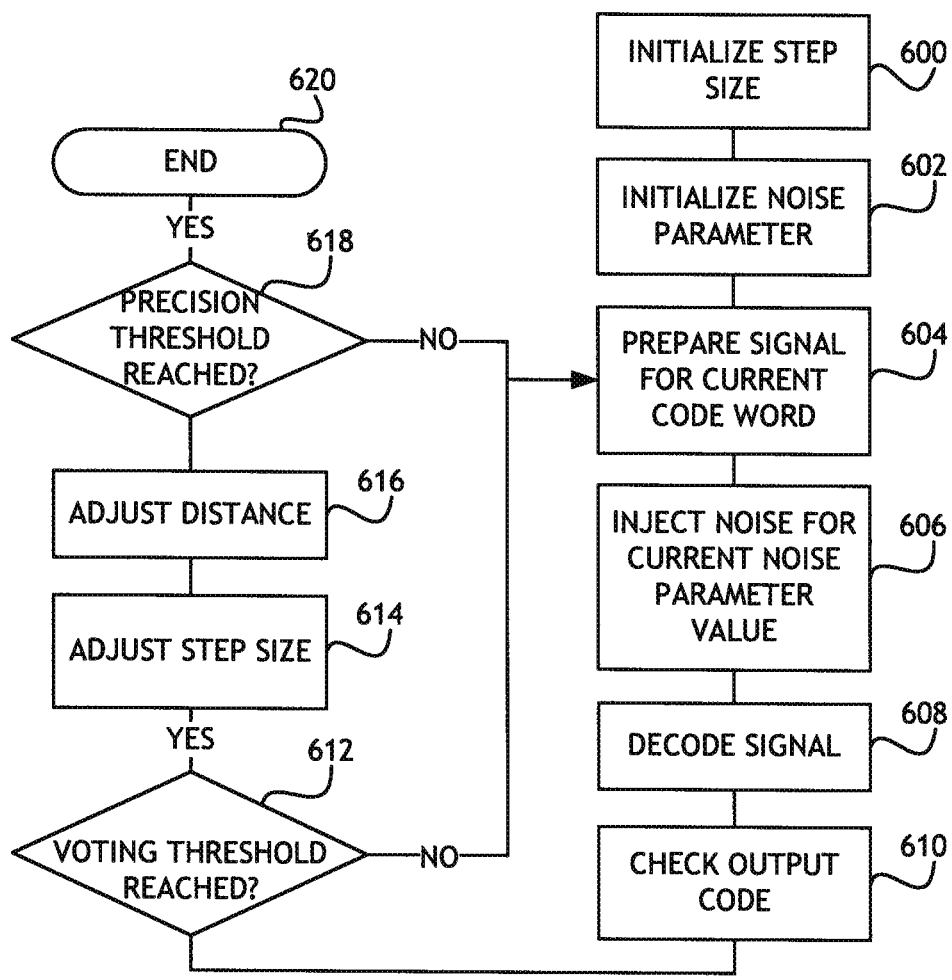
FIG. 6 shows a flowchart of a method for determining a trapping set distance from an error boundary through vote counting.

Referring to FIG. 6, a flowchart of a method for determining a trapping set distance from an error boundary through vote counting is shown. When determining dominant trapping sets in a list of trapping sets, such as in FIG. 5, a processor may find a distance value for a codeword list relative to a trapping set. To find such distance, the processor may employ a vote counting methodology. A processor may initialize 600 a search step size to set a noise level change for following iterations of the voting process, and initialize 602 noise parameters that may allow the processor to calculate a noise level for a given distance, codeword or list of codewords and trapping set. The processor may then enter a loop to process codewords and count votes. The processor may prepare 604 a signal corresponding to the current codeword from the list of codewords. The processor may then inject 606 noise according to current noise parameter values. Noise may be determined based on a function related to the channel type (AWGN, PR, jitter, etc.), a distance, the codeword and the trapping set. The processor may then decode 608 the noisy signal and check 610 the decoded output to determine if the noisy signal was decoded to the correct codeword or the trapping set. If the processor determines that the noisy signal was decoded correctly, the processor may register a vote indicating the capacity of the LDPC code to handle a higher noise level (move to the "right" in terms of an error boundary graph); if the processor determines that the noisy signal was decoded incorrectly (the expected trapping set or some other trapping set), the processor may register a vote indicating the decode failure (move to the "left" in terms of an error boundary graph). The processor may then determine 612 if a threshold of "left" votes has been reached; if not, the processor may advance to the next codeword in the list of codewords and prepare 604 a signal corresponding to the new codeword. The process may continue until all of the codewords in the list of codewords have been processed or the processor determines 612 that a threshold of "left" votes has been reached.

When a threshold of "left" votes is reached, the processor may adjust 614 the step size of noise level change according to the search algorithm being employed. For example; in a binary search algorithm, the step size may be half the previous step size. In one embodiment of the present invention, step size adjustments may be weighted to favor a predicted result and thereby accelerate the search process. For example; a step adjustment to the "left" (decreased noise level) may be proportional to the number of "left" votes in the previous iteration, while a step adjustment to the "right" (increased noise level) may be inversely proportional to the number of "left" votes in the previous iteration.

The processor may then adjust 616 the distance value used to calculate the noise. Distance may be adjusted according to the direction of the adjustment ("left" or "right") and the step size.

The processor may then determine 618 if a precision threshold has been reached. A precision threshold may be based on the step size adjustment. If the step size adjustment is less than a certain arbitrary value, the method has determined a critical noise level for the trapping set and the process may end 620. If the step size adjustment is greater than the threshold value, the processor may prepare 604 a codeword from the list of codewords (and proceed through the list of codewords as described herein) and inject 606 noise according to the newly defined parameters. The process may continue until a precision threshold is reached.

Figure 7:
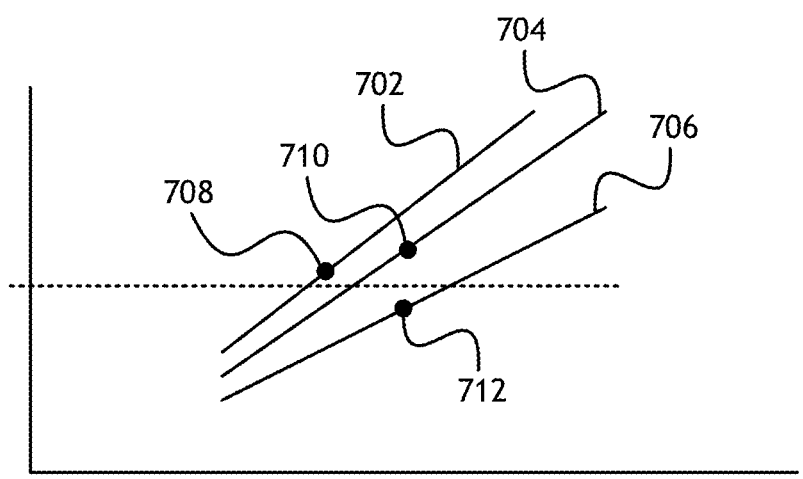
FIG. 7 shown a graph representation of a dependency between distance and noise level in a voting based system.

Referring to FIG. 7, a graph representation of a dependency between distance and noise level in a voting based system is shown. In the graph, the vertical axis represents a distance and the horizontal axis represents a noise level. In at least one embodiment of the present invention, distance and noise for a particular LDPC code may be related by some known function based on a codeword and a trapping set. A first pattern 702 may be defined by the function relating distance and noise for a first given codeword list and trapping set. A second pattern 704 may be defined by the function relating distance and noise for a second given codeword list and trapping set. A third pattern 706 may be defined by the function relating distance and noise for a third given codeword list and trapping set. Each of the first pattern 702, second pattern 704 and third pattern 706 may correspond to different codeword lists but one trapping set.

Each pattern 702, 704, 706 may include an error boundary 708, 710, 712 that defines a noise level where codewords may be decoded as trapping sets. Each error boundary 708, 710, 712 may be identified through iterative processes such as those set forth herein. In a voting based system, a processor may iteratively processes codewords at a certain distance until a threshold number of decoding failures occur, at which point the distance may be moved "left" and further processing at that distance may be terminated.

By these methods, an accurate distance value for a trapping set may be determined more quickly than methods employed in the prior art.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for determining a distance value for a trapping set comprising:
    producing a plurality of signals with a computer processor, each of the plurality of signals corresponding to a codeword in a set of codewords associated with a LDPC code stored in a computer memory;
    injecting noise into each of the plurality of signals with the computer processor;
    decoding each of the plurality of signals with the computer processor;
    determining if each of the plurality of signals decoded correctly with the computer processor; and
    recording a vote for each of the plurality of signals based on the determination of whether the signal decoded correctly.

2. The method of claim 1, wherein the vote corresponds to an indication that the signal decoded into a trapping set.

3. The method of claim 2, further comprising determining with the computer processor that a predetermined threshold number of votes have been reached in a vote count corresponding to indications that signals decoded into the trapping set.

4. The method of claim 3, further comprising adjusting with the computer processor a distance step size.

5. The method of claim 4, wherein the adjustment to the distance step size is at least partially based on the vote count.

6. The method of claim 4, further comprising adjusting with the computer processor a distance value based on the distance step size.

7. The method of claim 6, further comprising determining with the computer processor that a predetermined threshold precision has been reached for the distance value based on the distance step size.

8. The method of claim 1, wherein the vote corresponds to an indication that the signal decoded correctly.

9. A method for ordering a plurality of trapping sets comprising:
    receiving with a computer processor a set of codewords associated with a LDPC code;
    receiving with the computer processor a set of trapping sets associated with the LDPC code;
    determining with the computer processor and to within a predetermined threshold precision, a distance value associated with each trapping set in the set of trapping sets; and
    ordering with the computer processor the set of trapping sets according to the distance value associated with each trapping set,
    wherein:
        wherein determining the distance value comprises calculating a set of noise levels which cause more than a predetermined threshold number of signals to decode into the trapping set associated with such distance value.

10. The method of claim 9, wherein determining a distance value associated with each trapping set comprises:
    producing with the computer processor a plurality of signals, each of the plurality of signals corresponding to a codeword in the set of codewords;
    injecting noise into each of the plurality of signals with the computer processor;
    decoding with the computer processor each of the plurality of signals;
    determining with the computer processor if each of the plurality of signal decoded correctly; and
    recording with the computer processor a vote for each of the plurality of signals based on the determination of whether each of the plurality of signals decoded correctly.

11. The method of claim 10, wherein the noise is produced according to a function relating the noise to the distance value, one or more codewords in the set of codewords and a trapping set in the set of trapping sets.

12. The method of claim 11, further comprising determining with the computer processor that a threshold number of votes have been reached in a vote count corresponding to indications that signals decoded into the trapping set.

13. The method of claim 12, further comprising adjusting with the computer processor a distance step size.

14. The method of claim 13, further comprising adjusting with the computer processor a distance value based on at least one of the vote count and distance step size.

15. The method of claim 14, further comprising producing with the computer processor a new noise level according to the function relating the noise to the distance value, the one or more codewords in the set of codewords and the trapping set in the set of trapping sets, wherein the distance value is the adjusted distance value.

16. An apparatus for ordering trapping sets comprising:
    a processor;
    memory connected to the processor; and
    computer executable program code configured to execute on the processor,
    wherein:
        the computer executable program code is configured to:
            receive a set of codewords associated with a LDPC code;
            receive a set of trapping sets associated with the LDPC code;
            determine a distance value associated with each trapping set in the set of trapping sets, such distance value comprising a noise level causing more than a threshold number of codewords to decode into the associated trapping set;
            order the set of trapping sets according to the distance value associated with each trapping set;
            determine each distance value by finding a set of noise levels that cause more than a threshold number of signals, each signal corresponding to a codeword in the set of codewords, to decode into the trapping set associated with such distance value; and
            determine each distance value within a threshold precision.

17. The apparatus of claim 16, wherein the computer executable program code is further configured to:

produce a signal corresponding to a first codeword in the set of codewords;
inject noise into the signal;
decode the signal;
determine if the signal decoded correctly; and
record a vote, in a vote count, based on the determination of whether the signal decoded correctly, the vote corresponding to an indication that the LDPC code could accommodate a greater noise level.

18. The apparatus of claim 17, wherein the computer executable program code is further configured to adjust a distance step size.

19. The apparatus of claim 18, wherein the computer executable program code is further configured to adjust a distance value based on at least one of the vote count and distance step size.

20. The apparatus of claim 19, wherein the computer executable program code is further configured to produce a noise level according to a function relating the noise to the adjusted distance value, a codeword from the set of codewords and a trapping set.

* * * * *